United States Patent
Chou et al.

(10) Patent No.: US 7,256,998 B2
(45) Date of Patent: Aug. 14, 2007

(54) HEAT-DISSIPATING STRUCTURE WITH AIR-GUIDING DEVICE

(75) Inventors: Chia-Min Chou, Taipei Hsien (TW); Hsiang-Chieh Tseng, Taipei Hsien (TW)

(73) Assignee: Giga-Byte Technology Co., Ltd., Taipei Hsien (TW)

( * ) Notice: Subject to any disclaimer, the term of this patent is extended or adjusted under 35 U.S.C. 154(b) by 233 days.

(21) Appl. No.: 11/113,189

(22) Filed: Apr. 25, 2005

(65) Prior Publication Data

US 2006/0238978 A1   Oct. 26, 2006

(51) Int. Cl.
   *H05K 7/20*   (2006.01)
(52) U.S. Cl. ...................................................... 361/698
(58) Field of Classification Search ................ 361/698, 361/699, 695
   See application file for complete search history.

(56) References Cited

U.S. PATENT DOCUMENTS

| | | | | |
|---|---|---|---|---|
| 6,019,165 A | * | 2/2000 | Batchelder | 165/80.3 |
| 6,477,045 B1 | * | 11/2002 | Wang | 361/700 |
| 6,809,928 B2 | * | 10/2004 | Gwin et al. | 361/699 |
| 6,909,608 B2 | * | 6/2005 | Fan | 361/700 |
| 2006/0219387 A1 | * | 10/2006 | Atarashi et al. | 165/80.4 |
| 2006/0268513 A1 | * | 11/2006 | Sheng et al. | 361/695 |

* cited by examiner

*Primary Examiner*—Hae Moon Hyeon
(74) *Attorney, Agent, or Firm*—Rosenberg, Klein & Lee

(57) ABSTRACT

A heat-dissipating structure is assembled on a Central Processing Unit, and has a water-cooling device, a fan and a support device. The support device is assembled between the water-cooling device and the fan to form an accommodating space. Hence, the heat-dissipating device can efficiently dissipate the heat from the Central Processing Unit and another electronic element that is disposed in the vicinity of the Central Processing Unit. Furthermore, the air-guiding device can guide the air from the fan to the correct place for cooling the Central Processing Unit or another electronic element.

2 Claims, 7 Drawing Sheets

HEAT-DISSIPATING STRUCTURE WITH AIR-GUIDING DEVICE

BACKGROUND OF THE INVENTION

1. Field of the Invention

The present invention relates to a heat-dissipating structure, and particularly relates to a heat-dissipating structure assembled on a Central Processing Unit (CPU). The heat-dissipating structure has a fan separated a distance from a water-cooling device by a support device. Additionally, the air from the fan is directed by an air-guiding device to the CPU and another element that disposed in the vicinity of the CPU for dissipating the heat.

2. Description of the Related Art

According to the development of the computer industry, the processing velocity of the CPU is faster, and then the heat from the CPU is higher. In order to dissipate the heat from the heat source to the external world, a heat-dissipating device and a fan usually be used to help to dissipate the heat.

The water-cooling device (water block) of the prior art is assembled on the CPU for dissipating the heat from the heat source of the CPU in order to obtain a perfect heat-dissipating effect.

Referring to FIG. 1, the water-cooling device 90 of prior art includes a main body 91 disposed on a heat surface of a CPU 92, and a flow channel 93 formed in the main body 91 for guiding the cooling fluid to circulate in the main body 91. The flow channel 93 connects to an external pipe and a pump to drive the cooling fluid to circulate in the main body 91 for dissipating the heat from the CPU 92.

However, the water-cooling device only can dissipate the heat from the CPU. Moreover, another electronic element disposes around the CPU, and will result more heat by the CPU. However the prior art cannot provide a heat-dissipating effect on another electronic element.

SUMMARY OF THE INVENTION

The present invention provides a heat-dissipating device. A fan provides wind through the accommodating space to dissipate the heat from the water-cooling device by an air-cooling method. Therefore, both the water-cooling method and the air-cooling method dissipates the heat of the CPU. Furthermore, after the wind from the fan blows to the water-cooling device, the wind changes the flow direction for blowing to another electronic element that disposes around the CPU. In other words, the present invention can dissipate efficiently the heat from the CPU and another electronic element that disposes around the CPU. Furthermore, the wind-guiding device can guide the wind from the fan to correct place for cooling the CPU or another electronic element. Hence the present invention can provide a comprehensive heat-dissipating effect on the CPU.

One aspect of the invention is a heat-dissipating structure. The heat-dissipating structure is assembled on a CUP, and has a water-cooling device, a fan and a support device. The support device is assembled between the water-cooling device and the fan to form an accommodating space.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objectives and advantages of the present invention will be more readily understood from the following detailed description when read in conjunction with the appended drawing, in which.

DETAILED DESCRIPTION OF PREFERRED EMBODIMENTS

Figure 1:
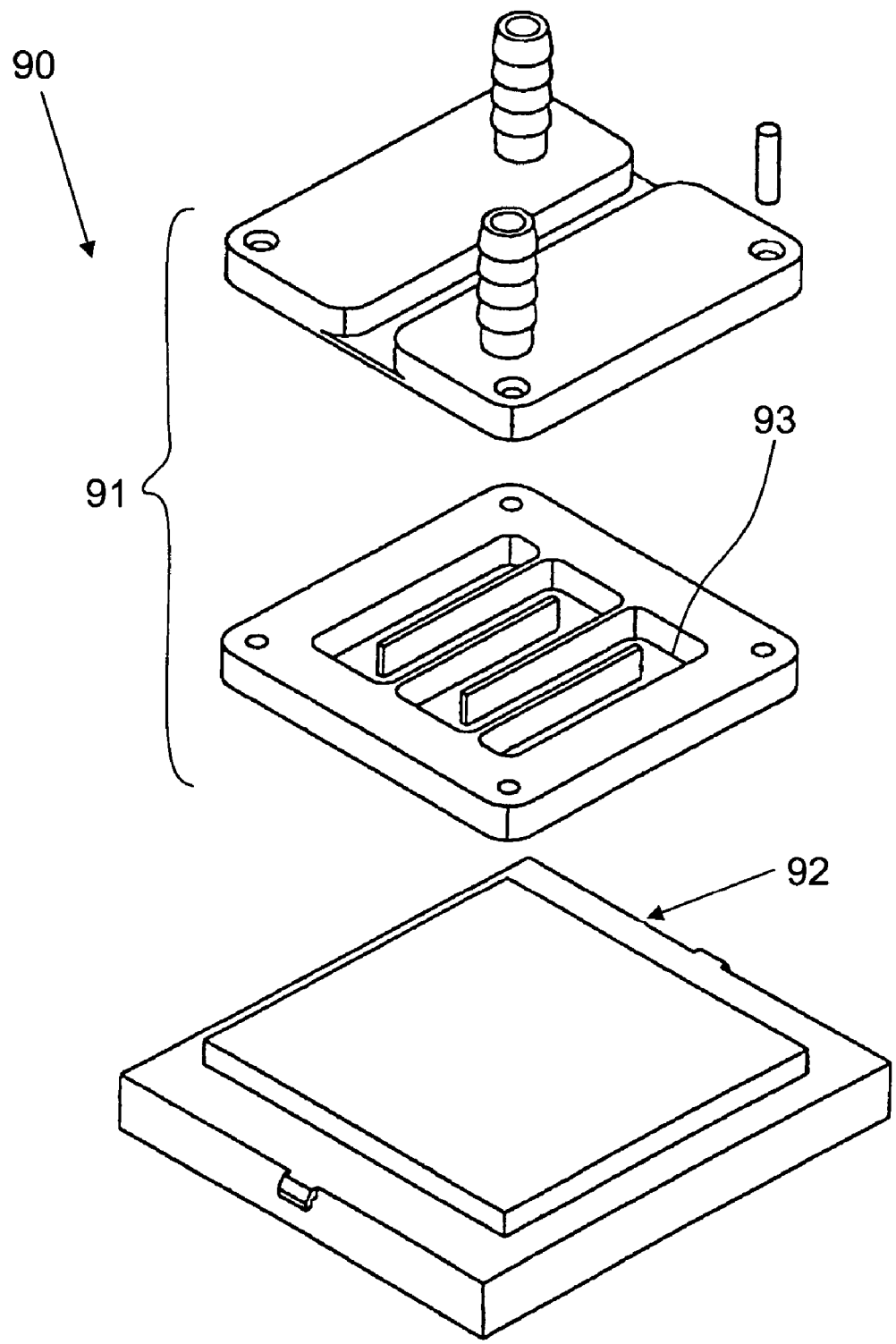
FIG. 1 is a perspective view of a water-cooling device of the prior art.
Figure 2:
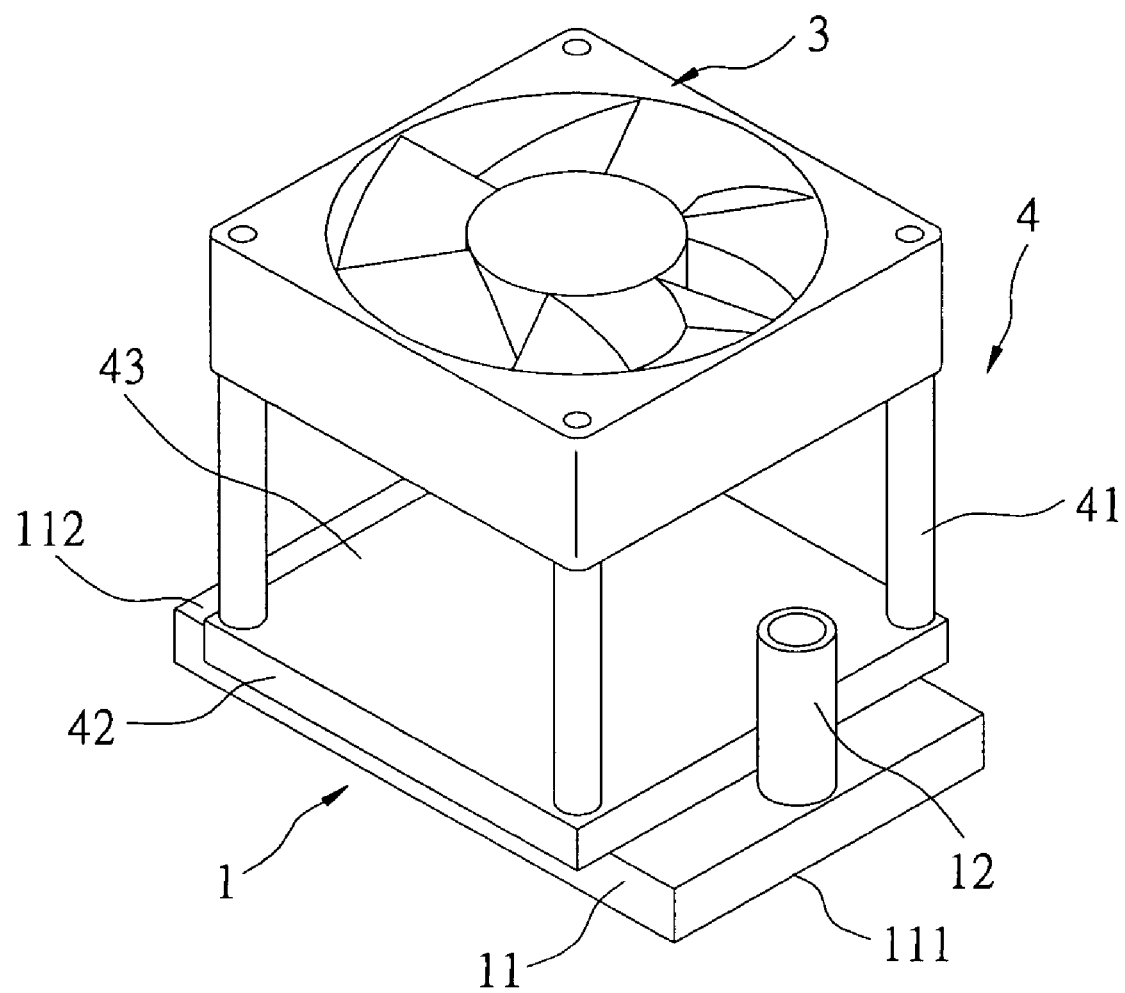
FIG. 2 is a perspective view of a water-cooling device of the present art.
Figure 3:
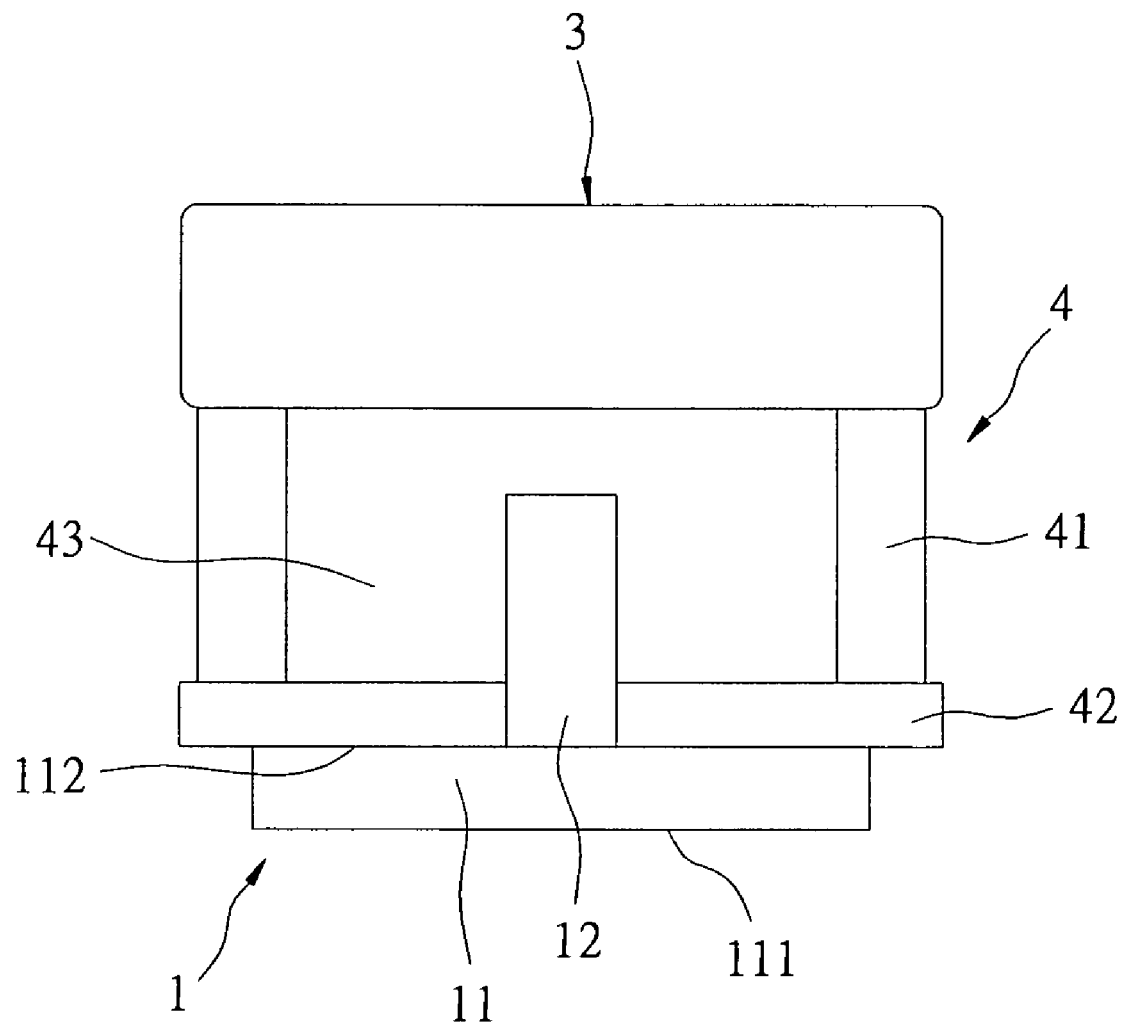
FIG. 3 is a side view of a water-cooling device of the present art.

Referring to FIGS. 2 and 3, the present invention provides a heat-dissipating structure assembled on a CPU 5. The heat-dissipating structure includes a water-cooling device 1, a fan 3 and a support device 4. Wherein the water-cooling device 1 has a main body 11. The main body 11 is made of metal materials with a good heat-conducting function. The main body 11 has a contact face 111 and a connection face 112 opposite to each other. The contact face 111 of the main body 11 is disposed on a heat surface 51 of the CPU 5. The main body 11 has a suitable flow channel (not shown) formed therein for guiding cooling fluid to circulate in the main body 11. The water-cooling device 1 has a connection 12 connecting to the flow channel, an external pipe and a pump for driving the cooling fluid to circulate in the main body 11.

The fan 3 is an axial-flow fan or another type of fan. The support device 4 is assembled between the water-cooling device 1 and the fan 3 for supporting the fan 3 to assemble over the water-cooling device 1. The support device 4 has four fixed posts 41 with same height. Each of the four fixed posts 41 has an upper side screwing to one corner of the fan 3 and a bottom seat 42 connecting to a lower side thereof. The bottom seat 42 is fixed on the main body 11 of the water-cooling device 1. The support device 4 is assembled between the water-cooling device 1 and the fan 3 to form an accommodating space 43. The accommodating space 43 is enclosed by the four fixed posts 41 to provide a wind flow space for when the fan 3 working.

Figure 4:
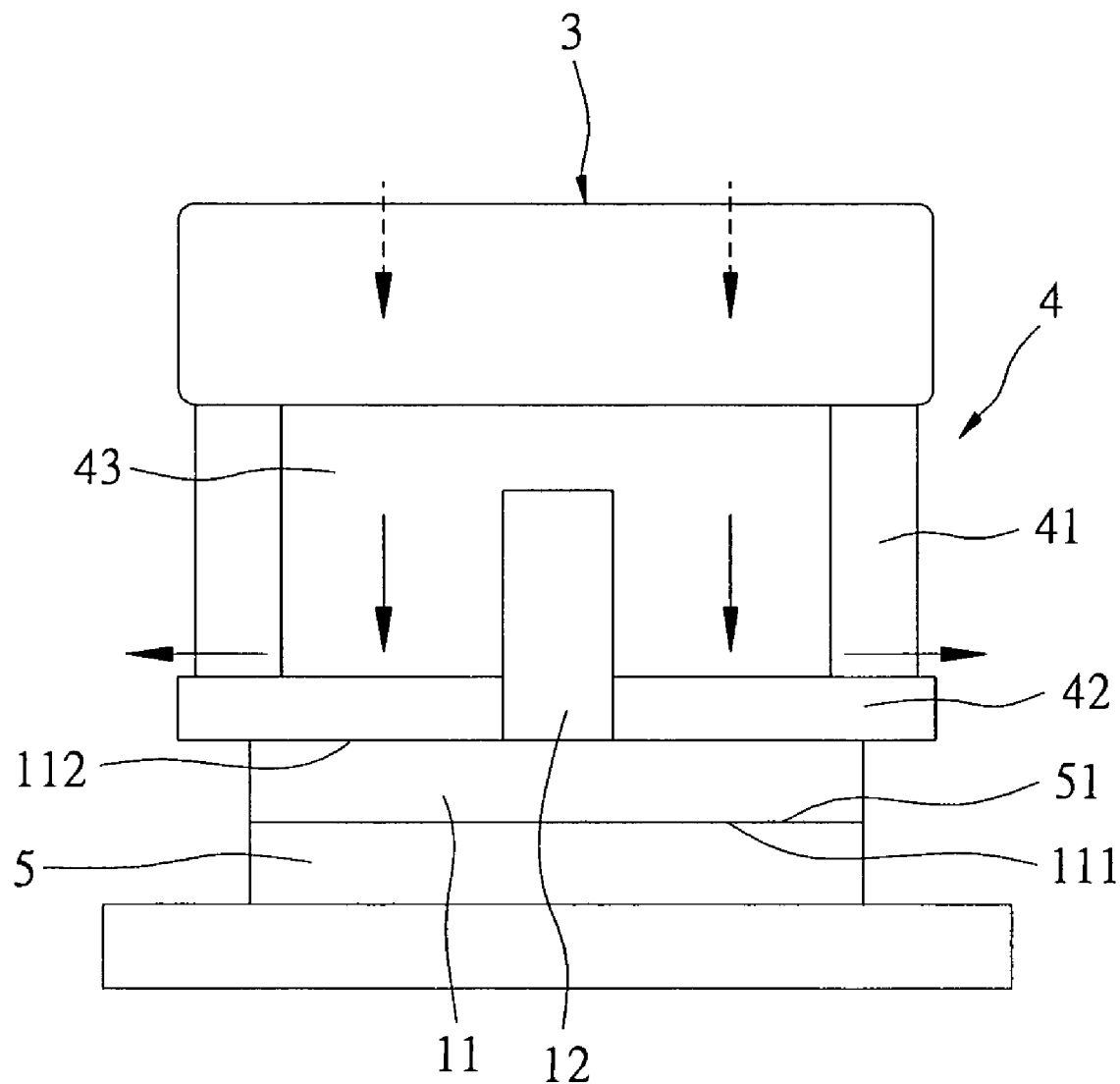
FIG. 4 is a schematic view of a water-cooling device in use according to the present art.

Referring to FIG. 4, the water-cooling device 1 is assembled on the heat surface of the CPU 5 by the contact face 111 of the water-cooling device 1 for dissipating the heat from the CUP 5 by a water-cooling method. The fan 3 provides wind through the accommodating space to dissipate the heat from the water-cooling device 1 and the CPU 5 by an air-cooling method. Therefore, both the water-cooling method and the air-cooling method dissipates the heat of the CPU 5. Furthermore, after the wind from the fan 3 blows to the water-cooling device 1, the wind changes the flow direction for blowing to another electronic element that disposes around the CPU 5.

Hence the wind from the fan 3 can blow to the water-cooling device 1 for dissipating the heat from the CPU 5, and blow to another electronic element that disposes around the CPU 5 for increasing the life of the electronic element.

Figure 5:
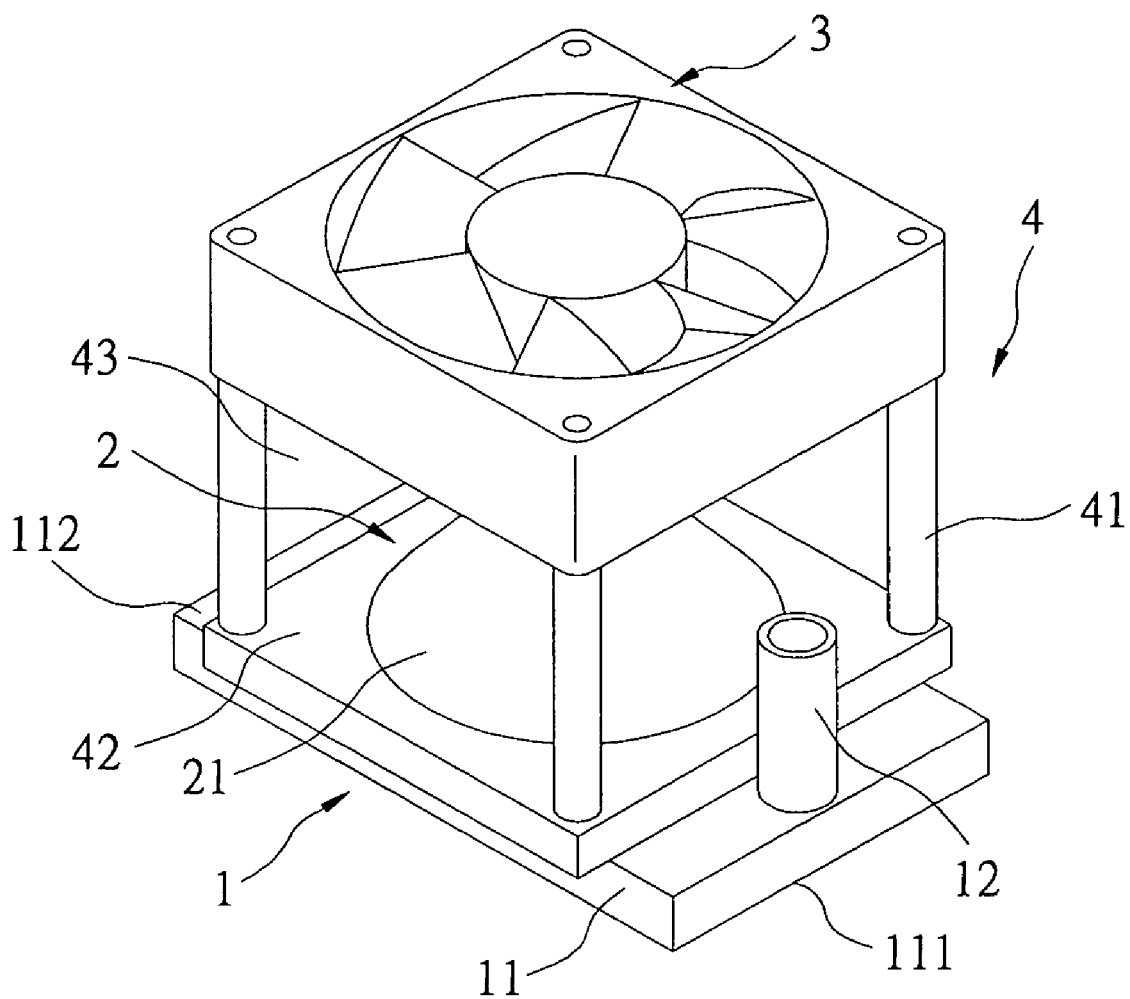
FIG. 5 is a perspective view of a water-cooling device of another embodiment according to the present art.
Figure 6:
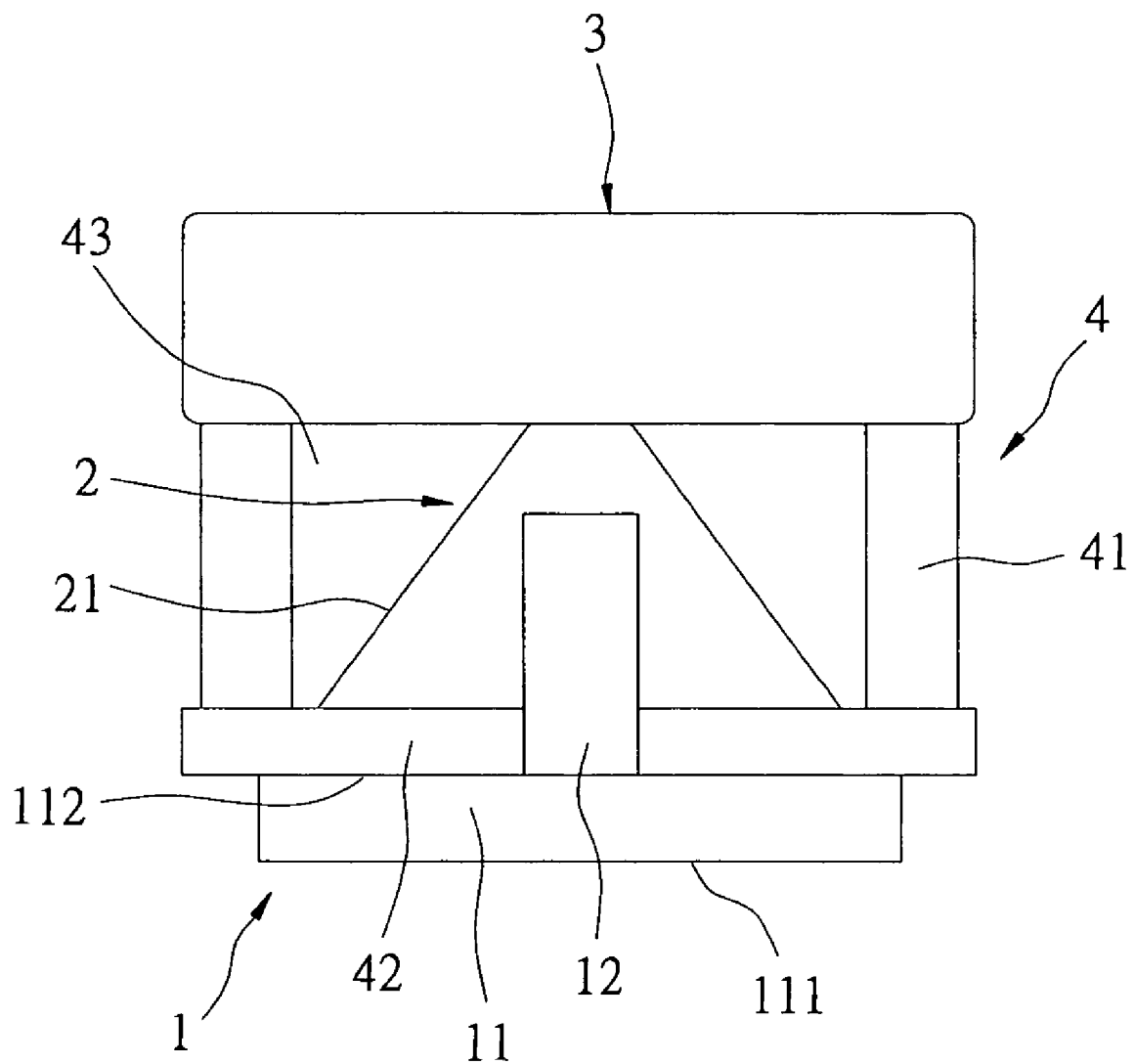
FIG. 6 is a side view of a water-cooling device of another embodiment according to the present art.
Figure 7:
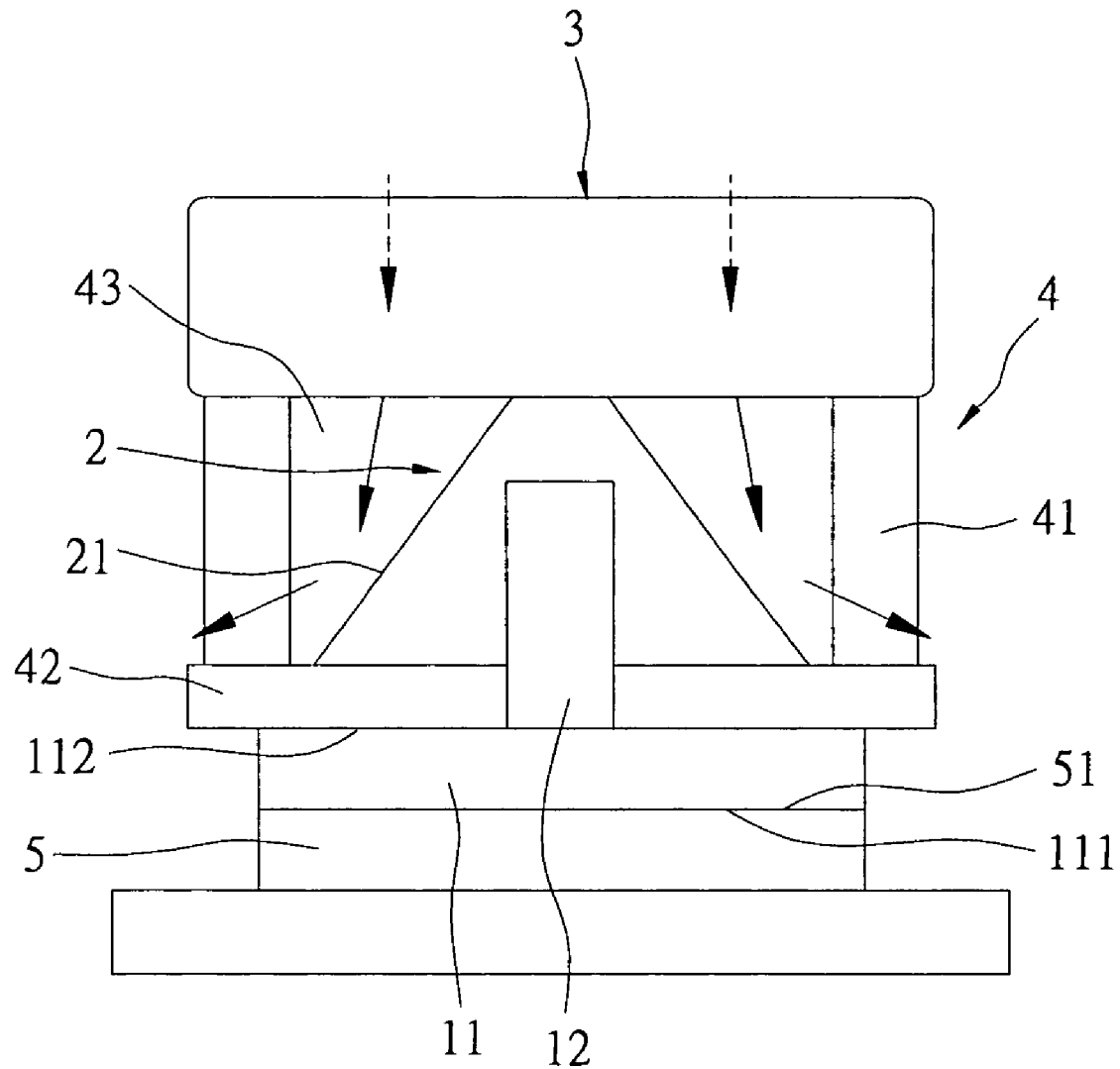
FIG. 7 is a schematic view of a water-cooling device of another embodiment in use according to the present art.

Referring to FIGS. 5 to 7, the heat-dissipating structure further includes a wind-guiding device 2 disposed on the main body 11 of the water-cooling device 1. The wind-guiding device 2 has a cone shaped in the present embodiment. The wind-guiding device 2 has a wind-guiding face 21 formed on a surface thereof. The wind-guiding face 21 has an oblique face extended outwardly from up to down for guiding the wind from vertical flow to horizontal flow, so as to change a flow direction of the wind. The wind-guiding device 2 has a bottom portion connecting to the bottom seat 42 of the support device 4. Hence the wind-guiding device 2 is disposed between the main body 11 of the water-cooling device 1 and the fan 3. The wind-guiding device 2 can be any shaped for changing the flow direction of the wind, or being omitted.

In other words, the present invention can dissipate efficiently the heat from the CPU and another electronic element that disposes around the CPU. Furthermore, the wind-guiding device can guide the wind from the fan to correct place for cooling the CPU or another electronic element. Hence the present invention can provide a comprehensive heat-dissipating effect on the CPU.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A heat-dissipating structure, comprising:

a water-cooling device having a main body with a contact face in contact with a surface of a central processing unit and an opposing connection face;

a fan for providing airflow to dissipate heat from the water-cooling device;

a support device assembled between the main body of the water-cooling device and the fan to form an accommodating space therebetween, the support device having a bottom seat affixed to the connection face of the water-cooling device and four fixed posts enclosing the accommodating space, each of the fixed posts having an upper side connecting with one corner of the fan and a lower side fixed to the bottom seat; and an air-guiding device disposed in the accommodating space and secured to the bottom seat, the air-guiding device having an air-guiding face on a surface thereof, the air-guiding face being an oblique face extending outwardly from an upper end thereof adjacent the fan to an opposing end adjacent the bottom seat;

wherein the fan provides air flow through the accommodating space and over the air-guiding face of the air-guiding device for guiding air flow from the fan to change direction and dissipate heat from the water-cooling device.

2. The heat-dissipating structure as claimed in claim 1, wherein the air-guiding device has a conical shaped.

* * * * *